United States Patent [19]
Pfannenmueller et al.

[11] Patent Number: 5,378,933
[45] Date of Patent: Jan. 3, 1995

[54] CIRCUIT ARRANGEMENT HAVING A SWITCHING AMPLIFIER

[75] Inventors: Gerhard Pfannenmueller, Oberasbach; Raimund Martin, Eggolsheim, both of Germany

[73] Assignee: Siemens Audiologische Technik GmbH, Erlangen, Germany

[21] Appl. No.: 29,542

[22] Filed: Mar. 11, 1993

[30] Foreign Application Priority Data

Mar. 31, 1992 [EP] European Pat. Off. ............ 92105549

[51] Int. Cl.⁶ .................... H03K 4/00; H03K 6/00; H03K 12/00
[52] U.S. Cl. .................... 327/172; 327/173; 327/174; 327/309
[58] Field of Search ............ 307/362, 265, 266, 267, 307/268, 269

[56] References Cited

U.S. PATENT DOCUMENTS

| | | | |
|---|---|---|---|
| 3,568,094 | 3/1971 | Metzger | 332/9 |
| 4,439,738 | 3/1984 | Atherton | 330/10 |
| 4,549,151 | 10/1985 | Kaneko | 307/265 |
| 4,592,087 | 5/1986 | Killion | 381/68 |
| 4,689,819 | 8/1987 | Killion | 381/68 |
| 4,903,302 | 2/1990 | Graclotti et al. | 381/31 |
| 5,220,203 | 6/1993 | McMorrow, Jr. et al. | 307/265 |

FOREIGN PATENT DOCUMENTS

| | | |
|---|---|---|
| 0079559 | 5/1983 | European Pat. Off. |
| 0326742 | 8/1989 | European Pat. Off. |
| 0503571 | 9/1992 | European Pat. Off. |
| 1942726 | 4/1970 | Germany |
| 2170617 | 9/1990 | Japan |

*Primary Examiner*—William L. Sikes
*Assistant Examiner*—Fetsum Abraham

[57] ABSTRACT

In a circuit arrangement having a switching amplifier (10), particularly for hearing aids, for limiting a pulse-width-modulated signal (S3) that is formed for a low-frequency signal (S1) and a higher-frequency delta signal (S2), a limitation of the output signal from the switching amplifier is achieved without a reduction in gain given only slight distortions. To that end, the pulse-width-modulated signal (S3) is supplied to a circuit (5; 14; 18) which modifies the width (D1, D2, D4) of individual pulses in the pulse-width-modulated signal (S3), whose width (D1, D2, D4) is longer or/and shorter than a maximum or minimum pulse width D3; D5) prescribable by the circuit (5; 14; 18). The pulse-width-modulated signal (S5; S6) modified by the circuit (5; 14; 18) can be supplied to the switching amplifier (10) as an input signal.

22 Claims, 2 Drawing Sheets

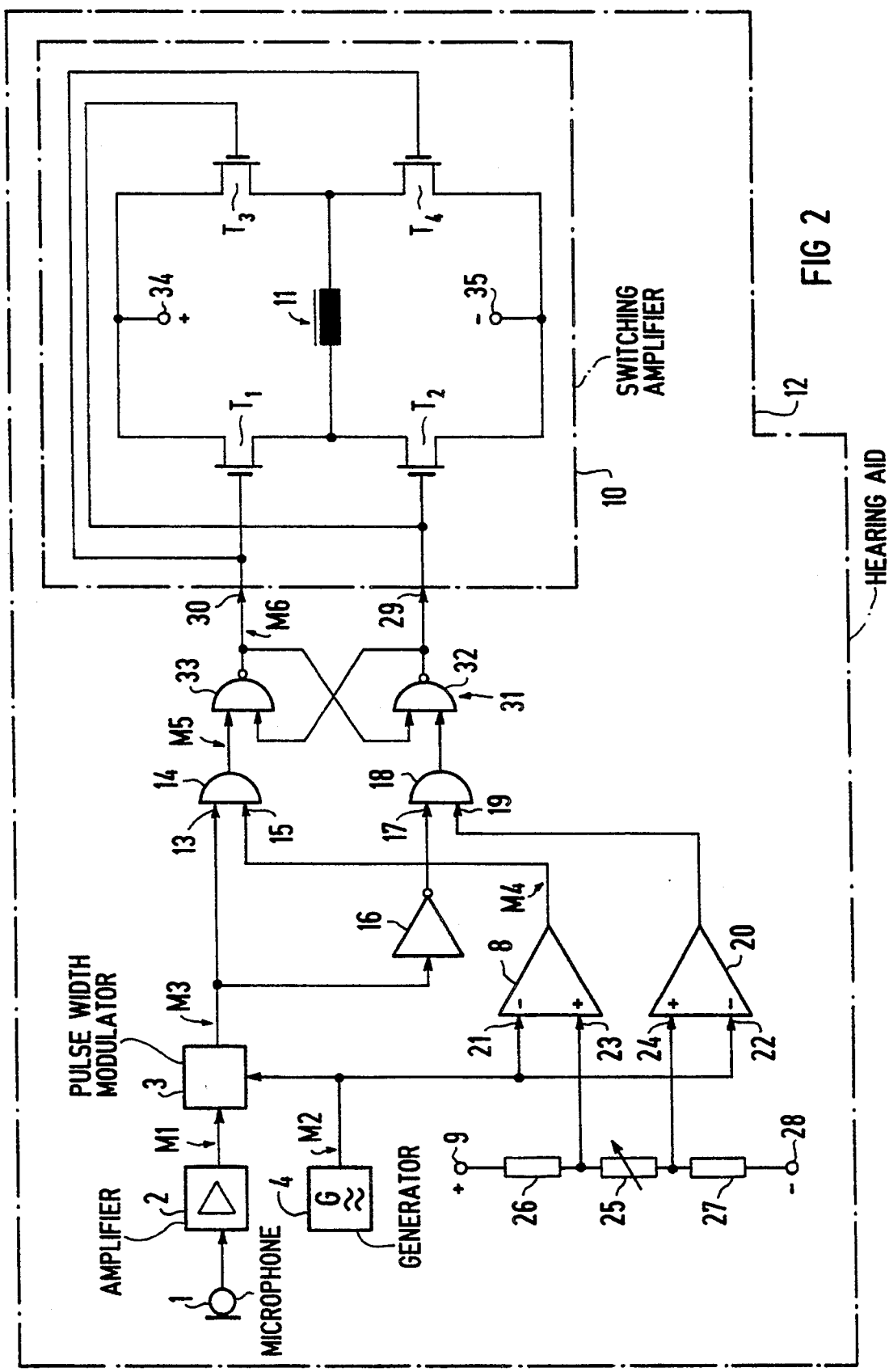

CIRCUIT ARRANGEMENT HAVING A SWITCHING AMPLIFIER

BACKGROUND OF THE INVENTION

The present invention is directed to a circuit arrangement having a switching amplifier, particularly for hearing aids, for limiting a pulse-width-modulated signal that is formed by a low-frequency signal and a higher-frequency delta signal.

German Patent 36, 16 752 discloses a circuit arrangement having a switching amplifier for hearing aids. In this known switching arrangement, a pulse-width-modulated signal is formed from a low-frequency audio signal and from a higher-frequency delta signal in a pulse duration modulator. After amplification of the pulse-width-modulated signal in the switching amplifier, the audio signal is detected from the different duration of the individual pulses of the pulse-width-modulated signal. This usually occurs in hearing aids on the basis of the low-pass effect of an earphone connected to the output of the switching amplifier.

In a pulse-width-modulated signal, the amplitude of the audio signal (useful signal) is coded in the width of the individual pulses of the pulse-width-modulated signal that controls the switching amplifier. The amplitude of the useful signal coded in the pulse width can therefore not be limited in the output stage (in the switching amplifier) with standard methods or clip circuits.

The audio signal (useful signal) has therefore already been limited in amplitude in a preliminary stage and a pulse-width modulation has been generated with this previously limited audio signal. As a result thereof, however, an undesirable spectral spread of the useful signal already occurs before the pulse width modulator. This results in undesirably high back-convolution products (high distortions) in the output signal.

In order to avoid this disadvantage, the operating voltage (or the operating current) for the switching amplifier has already been limited. This, however, leads to an undesirable reduction in gain and power of the demodulated output signal.

SUMMARY OF THE INVENTION

It is an object of the present invention to provide a circuit arrangement of the species initially cited with which a limitation of the output signal (useful signal) of the switching amplifier is achieved without a reduction in gain and with only slight distortions.

This object is achieved by a circuit arrangement having a switching amplifier for limiting a pulse-width-modulated signal that is formed from a low-frequency signal and a higher-frequency delta signal. The pulse-width-modulated signal is supplied to a limiting circuit which shortens the width of individual pulses in the pulse-width-modulated signal whose width, is greater than a maximum pulse width prescribable with the limiting circuit. Alternatively, or in addition thereto, the pulse-width-modulated signal is supplied to a limiting circuit which lengthens the width of individual pulses in the pulse-width-modulated signal whose width is shorter than a minimum pulse width prescribable with the limiting circuit. The pulse-width-modulated signal, that is modified by the limiting circuit, is supplied to the switching amplifier as an input signal.

The invention is based on the perception that the amplitude of the useful signal is contained in every pulse width of the pulse-width-modulated signal. In a circuit arrangement of the present invention the pulse width of the individual pulses in the pulse-width-modulated signal is varied (decreased or increased) when a maximum value or minimum value is reached. That is, the maximum or minimum width of the individual pulses is modified (limited) in the pulse-width-modulated signal. What this inventive limitation (modification) effects is that the pulse-width-modulated signal can be amplified in the switching amplifier without a reduction in gain and without additional distortions in the low-frequency signal (useful signal) arising before or during the amplification in the switching amplifier. These equivalent solutions can be alternatively utilized for switching amplifiers that do not operate in push-pull fashion. Both solutions can be utilized in common for push-pull circuits.

For limiting the maximum possible width of the individual pulses, the pulse-width-modulated signal is inventively supplied to a circuit, for example a gate circuit, that is preferably fashioned as an AND circuit. The maximum permitted width of individual pulses is prescribed with the gate circuit. When the pulse-width-modulated signal has individual pulses whose width is longer than the maximum width prescribed with the gate circuit, then these individual pulses are limited to the maximum permitted width in the gate circuit. The switching amplifier is driven with the pulse-width-modulated signal limited in this manner.

In a development of the present invention, a square-wave signal that defines the maximum permitted pulse width at the gate circuit is formed from the higher-frequency delta signal and from a threshold voltage with a comparison circuit. The delta signal used for generating the pulse-width-modulated signal is thus also inventively used for forming a gate pulse for defining the maximum permitted pulse width. As a result thereof, a symmetrical limitation of the individual pulses to be limited in the pulse-width signal is achieved without complicated circuit technology. What this means is that every limited individual pulse (viewed proceeding from an imaginary center line of the individual pulse, the center line being perpendicular the time axis) is shortened by an amount of approximately the same size at both sides in the direction of this time axis. Distortions that can arise after the demodulation of the limited, low-frequency signal (useful signal), given asymmetrical limitation of the individual pulses in the pulse-modulated signal, are avoided or at least considerably diminished by this symmetrical shortening (limitation) of the width of an individual pulse.

Further advantageous developments of the present invention are as follows.

A control signal for the limiting circuit is formed from the high-frequency delta signal, and the limiting circuit is composed of a gate circuit.

The pulse-width-modulated signal is supplied to a first input of a first AND circuit that forms the limiting circuit. A square-wave signal is formed from the higher-frequency delta signal and from a threshold voltage with a comparison circuit. The square-wave signal is supplied to a second input of the first AND circuit that has its output side coupled to an input of the switching amplifier.

The pulse-width-modulated signal is supplied as an inverted signal to a first input of a second AND circuit that forms the limiting circuit. Another square-wave signal is formed with a further comparison circuit from the higher-frequency delta signal and from another threshold voltage. This other square-wave signal is supplied to a second input of the second AND circuit that has its output side coupled to another input of the switching amplifier.

The AND circuit can be coupled to the switching amplifier via a flip-flop circuit. The comparison circuit can be a comparator circuit whose inverting input has the delta voltage supplied to it and whose non-inverting input has the threshold voltage supplied to it.

The threshold voltage is supplied to the comparison circuit via a preferably digitally programmable final control element. An input of one comparison circuit is connected via the final control element to an input of the other comparison circuit. The inputs of the comparison circuits connected via the final control element are each coupled to a respective terminal of an operating voltage supply of the circuit arrangement.

The circuit arrangement can be an integrated circuit or a component part of an integrated circuit.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 2 is an inventive circuit arrangement for limiting complementary pulse-width-modulated signals.

DESCRIPTION OF THE PREFERRED EMBODIMENT

Figure 1:
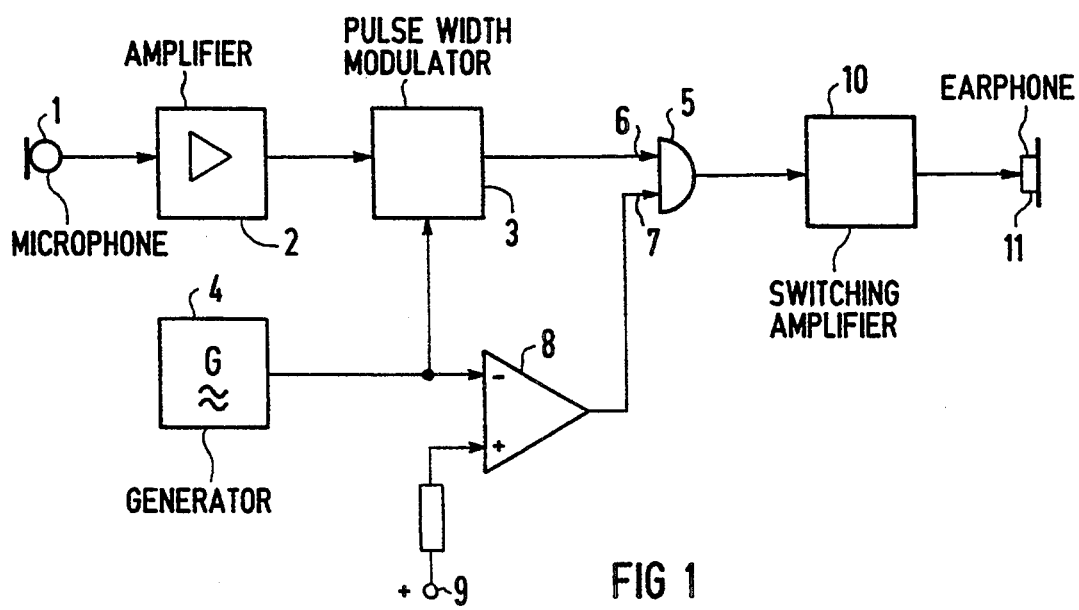
FIG. 1 is a circuit arrangement for the inventive limitation of a pulse-width-modulated signal.

FIG. 1 shows a schematic hearing aid circuit having a circuit arrangement of the present invention. An audio signal picked up by a microphone 1 is converted into electrical, low-frequency signal and is supplied to a pulse-width modulator 3 via an amplifier 2. A delta signal that is higher in frequency in comparison to the low-frequency signal is supplied to the pulse-width modulator 3 from a generator 4 that can also have pulse-shaping stages (not shown). A pulse-width-modulated signal that is supplied to a gate circuit 5 via a first input 6, is formed in the pulse-width modulator 3 in a known way from the low-frequency signal and from the delta signal. Individual pulses in the pulse-width-modulated signal are limited in width with the gate circuit 5 insofar as their width is greater than a width prescribable by the gate circuit 5.

In this exemplary embodiment, the gate circuit 5 is an AND circuit and receives a control signal via a second input 7. This control signal is formed in a comparison circuit 8. The delta signal supplied by the generator 4 is additionally employed for the formation of the control signal. To that end, the delta signal is compared to a prescribable, for example, manually settable threshold voltage in the comparison circuit 8. Comparators are particularly suitable for use as a comparison circuit. A square-wave control signal for the gate circuit 5 is then available at the output of the comparison circuit 8.

The pulse width of the individual pulses in the square-wave control signal can then be varied by an adjustable threshold voltage that is supplied via a terminal 9 of the comparison circuit 8. The width for the pulse-width-modulated signal is controlled in the gate circuit 5 with this variable setting of the threshold voltage. Consequently, the size of the limitation of the pulse width of the pulse-width modulated signal can be controlled with the threshold voltage at the comparison circuit 8. A switching amplifier 10, to which an earphone 11 is connected in a known way, is driven with the pulse-width signal limited by the gate circuit 5.

Figure 3:
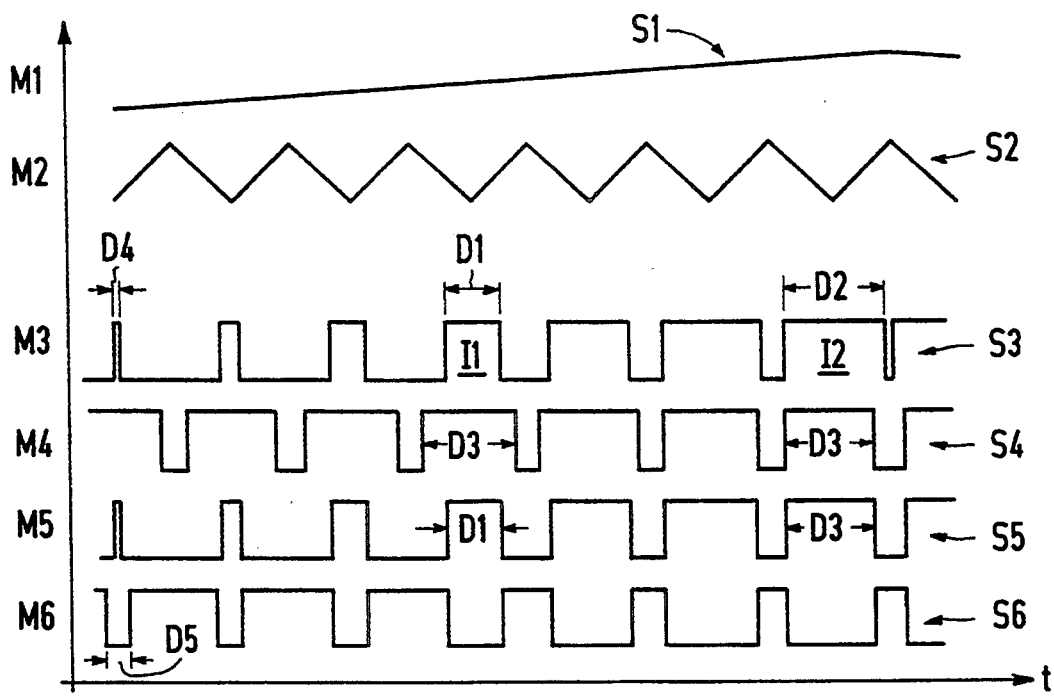
FIG. 3 is an illustration of a few signals that can occur in inventive circuit arrangements of FIG. 1 and/or of FIG. 2.

FIG. 2 shows a circuit arrangement of the invention which has further circuit parts in addition to the circuit parts set forth in FIG. 1 and, in particular, is suitable for a symbolically illustrated hearing aid 12 whose switching amplifier 10 operates in push-pull fashion. To facilitate an understanding of the circuit arrangement, FIG. 3 shows a few signals that can be measured within this circuit arrangement at the measurement points respectively referenced M1 . . . M6.

A low-frequency signal S1 can be measured at a measuring point M1 in FIG. 2 between the amplifier 2 and the pulse-width modulator 3; FIG. 3 shows a portion of this low-frequency signal S1 with rising amplitude. The generator 4 in FIG. 2 supplies a delta signal S2 shown in FIG. 3 at the measuring point M2. A pulse-width-modulated signal S3 that can be measured at the measuring point M3 at the output of the pulse-width modulator 3 derives from the processing of the signals S1 and S2 in the pulse-width modulator 3. This pulse-width-modulated signal S3 is supplied via a first input 13 (FIG. 2) to a gate circuit fashioned as first AND circuit 14. The first AND circuit 14 has a control signal supplied to it on a second input 15 from the comparison circuit 8 that has already been set forth in detail in FIG. 1. The control signal is a square-wave and can be measured at measuring point M4 in FIG. 2; it is shown as a square-wave signal S4 in FIG. 3.

It may be derived from FIG. 3 that the pulse-width-modulated signal S3 has individual pulses, for example I1, I2, having different pulse widths D1 and D2. In the case of the control signal S4, all individual pulses have respectively the same pulse width D3. The maximally permitted pulse width of the individual pulses and the pulse-width-modulated signal S3 is limited to the pulse width D3. FIG. 3 shows such a limited, pulse-width-modulated signal S5. This signal is measurable at the measuring point M5 at the output of the AND circuit 14 (FIG. 2). It may be derived from the limited pulse-width signal S5, shown in FIG. 3, that the individual pulse I1 in the signal S3 has the same width D1 as the corresponding pulse in the limited signal S5. The individual pulse I1, consequently, has remained unlimited. By contrast, the pulse I2 in the unlimited signal S3 is limited to the maximum permitted width D3 in the limited signal S5 (chronologically shortened).

In FIG. 2, the circuit arrangement of the present invention is fashioned for push-pull operation. To that end, the pulse-width-modulated signal S3 is supplied as an inverted signal via an invertor 16 to a first input 17 of a second AND circuit 18 that operates as an gate circuit. The second AND circuit is supplied with a square-wave signal via a second input 19, this square-wave signal representing a complementary signal with respect to the square-wave signal S4. This complementary square-wave signal is formed in a further comparison circuit 20 from a comparison of the higher-frequency delta signal S2 to a different threshold voltage. The different threshold voltage is thereby set complementary to the threshold voltage at the comparison circuit 8. As a result thereof, the critical advantage derives that the demodulated low-frequency signal is symmetrically limited, i.e. the positive and negative amplitudes are limited proceeding from the same amount with reference to an average value (symmetry line). Consequently, the distortions are again reduced as a consequence of this symmetrical limitation.

In a development of the present invention, the two comparison circuits 8 and 20 are fashioned as comparator circuits to whose inverting inputs 21 and 22 the delta voltage (the delta signal) S2 is supplied. A non-inverting input 23 at the comparison circuit 8 and a non-inverting input 24 are connected to one another via a final control element 25, for example a potentiometer. The inputs 23 and 24 connected via the final control element 25 are thereby coupled to a respective terminal (positive or negative) of the circuit arrangement. The coupling to the positive terminal in the circuit arrangement of FIG. 2 occurs via a resistor 26 and the terminal 9. The coupling to the negative terminal occurs via a resistor 27 and a terminal 28. The resistors 26 and 27 can be matched to the final control element 25 such that the limitation of the pulse-width signal can be switched on and off with the final control element 25. The final control element 25 can also be a digitally settable and/or programmable final control element.

As a result, a limited pulse-width signal is likewise available at the output of the AND circuit 18, whereby (by contrast to the limited signal S5, see FIG. 3) the pulse width D4 of a short individual pulse is increased to a minimum value D5 in the signal S6. The pulse width D5 is not downwardly transgressed, whereby the minimum value D5 can be prescribed by the gate circuit that is AND circuit 18. The minimum permitted pulse width of the individual pulses in the pulse-width-modulated signal that is complementary to the signal S3 is consequently limited with the AND circuit 18. The limited and pulse-width-modulated push-pull signals generated in this way are available at the output side at the AND circuits 14 and 18 for coupling to an input 29 or 30 of the switching amplifier 10.

In a development of the present invention, a flip-flop circuit 31 having two trigger circuits 32 and 33 is provided for the coupling of the AND circuits 14 and 19 to the switching amplifier 10. In the case of a limitation of the pulse width, a balancing of the two signals at the inputs 29 and 30 of the switching amplifier 10 is required in the case of a limitation of the pulse width. Distortions can thereby be diminished again. FIG. 3 shows such a limited and balanced pulse-width modulated signal S6 that can be measured at the measuring point M6 in FIG. 2.

In FIG. 10, the switching amplifier 10 has four MOSFET transistors T1 through T4 working in switched mode. The transistors T1 and T2 as well as the transistors T3 and T4 are respectively fashioned complementary relative to one another. The switching amplifier 10 is supplied with operating voltage via terminals 34 and 35. As a result of the switched mode, either of the transistors T1 and T4 or T3 and T2 are simultaneously conductive. The time span within which these transistors are conductive is controlled by the respective pulse width of each and every pulse in the limited, pulse-width signal supplied via the inputs 29 and 30 of the switching amplifier. Consequently, given a change of the level in the pulse-width signal, the activated transistors change into the non-conductive condition and the transistors that were previously non-conductive are thus activated. As a result the earphone 11 arranged in the bridge arm of the switching amplifier 10 is switched between the operating voltage (positive and negative terminals) at the terminals 34 and 35. The limitation arises due to the shortening of, for example, an originally long individual pulse having a width D2 to having a width D3 (in this respect, see the signals S3 and S5 in FIG. 3). As a result of an individual pulse shortened in this way, the current or the voltage can no longer form at full magnitude at the earphone 11. As a result thereof, the low-frequency signal reproduced by the earphone 11 appears as an amplitude-limited signal.

As a result of the digital limitation of a low-frequency signal present here, no additional noise arises, the levels are reproducible and are digitally programmable and readable. The circuit has a more beneficial efficiency than known pre-stage limitation circuits. As a result of its structure, the circuit arrangement of the present invention can also be fashioned as an integrated circuit or as a component part of an integrated circuit. It is also advantageous that no loss in gain arises for low amplitudes. Moreover, with a simple auxiliary circuit a digital display signal that indicates the response of the limitation (clip effect) can also be derived.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. In a hearing aid a circuit arrangement having a switching amplifier and for limiting a pulse-width-modulated signal that is formed from a low-frequency signal and a higher-frequency delta signal, comprising a limiting circuit that receives the pulse-width-modulated signal and that limits the pulse-width-modulation signal between a maximum level and a minimum level, said limiting circuit at least shortening the width of individual pulses in the pulse-width-modulated signal that have a width greater than a maximum pulse width prescribed by the limiting circuit; and the pulse-width-modulated signal modified by the limiting circuit being supplied to the switching amplifier as an input signal.

2. The circuit arrangement according to claim 1, wherein the pulse-width-modulated signal is supplied to a first input of an AND circuit that forms said limiting circuit, and wherein a square-wave signal is formed from the higher-frequency delta signal and from a threshold voltage with a comparison circuit, said square-wave signal being supplied to a second input of said AND circuit, said AND circuit having an output coupled to an input of the switching amplifier.

3. The circuit arrangement according to claim 2, wherein the circuit arrangement further comprises a digitally programmable final control element, and wherein the threshold voltage is supplied to the comparison circuit via the digitally programmable final control element.

4. The circuit arrangement according to claim 3, wherein the comparison circuit has an input connected via the final control element to a respective terminal of an operating voltage of the circuit arrangement.

5. The circuit arrangement according to claim 1, wherein the circuit arrangement further comprises means for forming a control signal for the limiting circuit from the higher-frequency delta signal, and wherein the limiting circuit comprises a gate circuit.

6. The circuit arrangement according to claim 2, wherein the output of the AND circuit is coupled to the input of the switching amplifier via a flip-flop circuit.

7. The circuit arrangement according to claim 2, wherein the comparison circuit is a comparator having an inverting input that receives a delta voltage of the delta signal and a non-inverting input that receives the threshold voltage.

8. The circuit arrangement according to claim 1, wherein the circuit arrangement is an integrated circuit or is a component part of an integrated circuit.

9. In a hearing aid a circuit arrangement having a switching amplifier and for limiting a pulse-width modulated signal that is formed from a low-frequency signal and a higher-frequency delta signal, comprising: a limiting circuit that receives the pulse-width-modulated signal and that limits the pulse-width-modulation signal between a maximum level and a minimum level, said limiting circuit at least lengthening the width of individual pulses in the pulse-width-modulated signal that have a width less than a minimum pulse width prescribed by the limiting circuit; and the pulse-width-modulated signal modified by the limiting circuit being supplied to the switching amplifier as an input signal.

10. The circuit arrangement according to claim 9, wherein the pulse-width-modulated signal is supplied as an inverted signal to a first input of an AND circuit that forms said limiting circuit, and wherein a square-wave signal is formed from the higher-frequency delta signal and from a threshold voltage with a further comparison circuit, said square-wave signal being supplied to a second input of the AND circuit, said AND circuit having an output coupled to an input of the switching amplifier.

11. The circuit arrangement according to claim 10, wherein the circuit arrangement further comprises a digitally programmable final control element, and wherein the threshold voltage is supplied to the comparison circuit via the digitally programmable final control element.

12. The circuit arrangement according to claim 11, wherein the comparison circuit has an input connected via the final control element to a respective terminal of an operating voltage of the circuit arrangement.

13. The circuit arrangement according to claim 9, wherein the circuit arrangement further comprises means for forming a control signal for the limiting circuit from the higher-frequency delta signal, and wherein the limiting circuit comprises a gate circuit.

14. The circuit arrangement according to claim 10, wherein the output of the AND circuit is coupled to the input of the switching amplifier via a flip-flop circuit.

15. The circuit arrangement according to claim 10, wherein the comparison circuit is a comparator having an inverting input that receives a delta voltage of the delta signal and a non-inverting input that receives the threshold voltage.

16. The circuit arrangement according to claim 9, wherein the circuit arrangement is an integrated circuit or is a component part of an integrated circuit.

17. A circuit arrangement in a hearing aid having a switching amplifier and for limiting a pulse-width-modulated signal that is formed from a low-frequency signal and a higher-frequency delta signal, comprising: a limiting circuit that receives the pulse-width-modulated signal and that limits the pulse-width-modulated signal between a maximum level and a minimum level, said limiting circuit having means for shortening the width of individual pulses in the pulse-width-modulated signal that have a width greater than a predetermined maximum pulse width and having means for lengthening the width of individual pulses in the pulse-width-modulated signal that have a width less than a predetermined minimum pulse width; and the pulse-width-modulated signal modified by the limiting circuit being supplied to the switching amplifier as an input signal.

18. A circuit arrangement in a hearing aid having a switching amplifier and for limiting a pulse-width-modulated signal that is formed from a low-frequency signal and a higher-frequency delta signal, comprising: a limiting circuit that receives the pulse-width-modulated signal, said limiting circuit having means for shortening the width of individual pulses in the pulse-width-modulated signal that have a width greater than a predetermined maximum pulse width and having means for lengthening the width of individual pulses in the pulse-width-modulated signal that have a width less than a predetermined minimum pulse width; the pulse-width-modulated signal modified by the limiting circuit being supplied to the switching amplifier as an input signal; and the pulse-width-modulated signal being supplied to a first input of a first AND circuit and being supplied as an inverted signal to a first input of a second AND circuit; a first square-wave signal being formed from the higher-frequency delta signal and from a first threshold voltage with a first comparison circuit and a second square-wave signal being formed from the higher-frequency delta signal and from a second threshold voltage with a second comparison circuit; said first square-wave signal being supplied to a second input of the first AND circuit, said first AND circuit having an output coupled to a first input of the switching amplifier; and said second square-wave signal being supplied to a second input of the second AND circuit, said second AND circuit having an output coupled to a second input of the switching amplifier.

19. A circuit arrangement in a hearing aid having a switching amplifier and for limiting a pulse-width-modulated signal that is formed from a low-frequency signal and a higher-frequency delta signal, comprising: a limiting circuit that receives the pulse-width-modulated signal, said limiting circuit having means for shortening the width of individual pulses in the pulse-width-modulated signal that have a width greater than a predetermined maximum pulse width and having means for lengthening the width of individual pulses in the pulse-width-modulated signal that have a width less than a predetermined minimum pulse width; the pulse-width-modulated signal modified by the limiting circuit being supplied to the switching amplifier as an input signal; and the limiting circuit being coupled to the switching amplifier via a flip-flop circuit.

20. The circuit arrangement according to claim 18, wherein the circuit arrangement further comprises a final control element, wherein each of the comparison circuits is a comparator having an inverting input that receives a delta voltage of the delta signal and having a non-inverting input that receives a respective threshold voltage, and wherein the non-inverting input of the first comparison circuit is connected via the final control element to the non-inverting input of the second comparison circuit, and wherein the non-inverting inputs of the first and second comparison circuits are each coupled to a respective terminal of an operating voltage of the circuit arrangement.

21. A circuit arrangement having a switching amplifier and for limiting a pulse-width-modulated signal that is formed from a low-frequency signal and a higher-frequency delta signal, comprising: a limiting circuit that receives the pulse-width-modulated signal, said limiting circuit shortening the width of individual pulses in the pulse-width-modulated signal that have a width greater than a maximum pulse width prescribed by the limiting circuit; the pulse-width-modulated signal modified by the limiting circuit being supplied to the switching amplifier as an input signal; and an output of the limiting circuit being coupled to an input of the switching amplifier via a flip-flop circuit.

22. A circuit arrangement having a switching amplifier and for limiting a pulse-width modulated signal that is formed from a low-frequency signal and a higher-frequency delta signal, comprising: a limiting circuit that receives the pulse-width-modulated signal, said limiting circuit lengthening the width of individual pulses in the pulse-width-modulated signal that have a width less than a minimum pulse width prescribed by the limiting circuit; the pulse-width-modulated signal modified by the limiting circuit being supplied to the switching amplifier as an input signal; and an output of the limiting circuit being coupled to an input of the switching amplifier via a flip-flop circuit.

* * * * *